(12) United States Patent
Dutton et al.

(10) Patent No.: US 10,132,921 B2
(45) Date of Patent: Nov. 20, 2018

(54) LIGHT COMMUNICATIONS RECEIVER AND DECODER WITH TIME TO DIGITAL CONVERTERS

(71) Applicant: STMICROELECTRONICS (RESEARCH & DEVELOPMENT) LIMITED, Marlow (GB)

(72) Inventors: Neale Dutton, Edinburgh (GB); John Kevin Moore, Edinburgh (GB)

(73) Assignee: STMICROELECTRONICS (RESEARCH & DEVELOPMENT) LTD, Marlow (GB)

( * ) Notice: Subject to any disclaimer, the term of this patent is extended or adjusted under 35 U.S.C. 154(b) by 189 days.

(21) Appl. No.: 15/342,028

(22) Filed: Nov. 2, 2016

(65) Prior Publication Data
US 2018/0123611 A1    May 3, 2018

(51) Int. Cl.
*G01S 7/487* (2006.01)
*G01S 7/486* (2006.01)
(Continued)

(52) U.S. Cl.
CPC .............. *G01S 7/4873* (2013.01); *G01J 1/44* (2013.01); *G01S 7/4861* (2013.01);
(Continued)

(58) Field of Classification Search
CPC ................. G01J 1/44; G01J 2001/4466; G01J 2001/442; G04F 10/005; H04N 5/378; G01T 3/005; G01T 1/2018; G01T 1/247; G01T 1/16; G01T 1/29; G01T 1/36; G01S 17/06; G01S 17/00; G01S 7/4863; G01S 7/4873; G01S 7/28; G01S 7/483;
(Continued)

(56) References Cited

U.S. PATENT DOCUMENTS

| 9,864,049 B2 * | 1/2018 | Mellot .................. G01S 7/4865 |
| 2012/0075615 A1 * | 3/2012 | Niclass ................. G01S 7/4814 356/5.01 |

(Continued)

FOREIGN PATENT DOCUMENTS

| EP | 2 469 301 A1 | 6/2012 |
| EP | 2 728 373 A1 | 5/2014 |

(Continued)

*Primary Examiner* — Que T Le
*Assistant Examiner* — Jennifer Bennett
(74) *Attorney, Agent, or Firm* — Seed Intellectual Property Law Group LLP (57) ABSTRACT

The present disclosure includes a method that includes generating a decoded output signal that corresponds to reflected light received by a plurality of single photon avalanche diodes (SPAD) by removing ambient light from a plurality of SPAD array output signals. The removing of ambient light including synchronizing the plurality of SPAD array output signals by using a plurality of parallel time to digital converters, each time to digital converter outputting a synchronized SPAD array output signal, determining a plurality of flexible thresholds for each one of the synchronized SPAD array output signals, comparing current data on the synchronized SPAD array output signals with the respective ones of the flexible threshold in a filter, and outputting the first output signal.

16 Claims, 7 Drawing Sheets

(51) Int. Cl.
*G04F 10/00* (2006.01)
*G01J 1/44* (2006.01)

(52) U.S. Cl.
CPC .......... *G01S 7/4865* (2013.01); *G04F 10/005* (2013.01); *G01J 2001/4466* (2013.01)

(58) Field of Classification Search
CPC ..... G01S 7/4861; G01S 7/4865; H03L 7/085; H03L 7/087; H03L 2207/50; G01C 3/08
See application file for complete search history.

(56) References Cited

U.S. PATENT DOCUMENTS

| | | | | |
|---|---|---|---|---|
| 2012/0162632 A1* | 6/2012 | Dutton | ............... | G01S 7/486 356/5.01 |
| 2012/0268105 A1* | 10/2012 | Mann | ............... | G01T 1/17 324/120 |
| 2013/0300838 A1* | 11/2013 | Borowski | ............... | G01S 7/486 348/46 |
| 2015/0041625 A1* | 2/2015 | Dutton | ............... | G01T 1/2985 250/208.1 |
| 2016/0246262 A1* | 8/2016 | Liu | ............... | G04F 10/005 |
| 2017/0184709 A1* | 6/2017 | Kienzler | ............... | G01S 7/4865 |

FOREIGN PATENT DOCUMENTS

| | | | |
|---|---|---|---|
| GB | 2485995 A | 11/2010 |
| GB | 2486668 A | 12/2010 |
| GB | 2505705 A | 9/2012 |
| WO | 2010149593 A1 | 12/2010 |

\* cited by examiner

LIGHT COMMUNICATIONS RECEIVER AND DECODER WITH TIME TO DIGITAL CONVERTERS

BACKGROUND

Technical Field

The present disclosure is directed to near infrared and visible light communications systems that include time to digital converters.

Description of the Related Art

Time of flight sensors are incorporated in a variety of products for range finding, depth profiling, 3D imaging, and medical imaging, to name a few. Time of flight measurements include measuring a length of time between an emitted signal and a received signal. A distance can be calculated based on this length of time. Single Photo Avalanche Diode (SPAD) arrays are incorporated in time of flight sensors, where there is often a reference array and a return detection array. Each of the SPAD arrays receives the emitted signal.

In order to measure the time light takes to travel a short distance in millimeter or centimeter range, very precise timing resolution is required. One method for achieving the required degree of timing accuracy is to employ SPAD devices and implement a Time to Digital Converter to convert the time of photon arrival to a digital code for processing. It can be the case that the returned signal from a distant, low reflectance, target can be very low bringing challenges in extracting the required information.

These SPAD arrays receive the reflected emitted signal and also receive ambient light. This ambient light adds Photon Shot noise and degrades the time of flight sensor's measurement. This noise contribution brings challenges in extracting the key parameters of the returned signal such as amplitude, time or phase shift, pulse time length (temporal width), etc.

BRIEF SUMMARY

The present disclosure is directed to a system that includes a light communication receiver and decoder to work with low signal intensity of a reflected emitted signal and increase a bandwidth.

The system includes time to digital converters to synchronize outputs from a light sensor coupled to the light communication receiver and decoder. The digital code stream output from the TDC can be processed to extract data from the received signal. In an amplitude based encoding scheme such as OOK (On Off Keying), where ambient light variations over time may cause fluctuations in the DC level of a received signal, the thresholds associated with a HIGH or LOW level can be dynamically controlled by the processing, with no modification to the front end TDC. The outputs are analyzed to determine flexible or changing thresholds that change over time as ambient light changes in the outputs. For example, if the sun comes out from behind a cloud, the ambient light will change significantly even if a transmitted signal from a transmission base station, or a reflected signal from the light sensor do not change significantly. Said differently, if the light sensor is in a mobile device that is holding still in an outdoor environment, a distance from the light sensor to an object for which the range is being detected is not changing. However, if the sun comes out from behind a cloud, the overall light detected by the light sensor changes significantly, even though the light reflected back from the object to the light senor will not have changed. The system of the present disclosure is configured to detect the ambient light and changes in the ambient light to remove the ambient light based on a recent status of the ambient light. This ultimately outputs a decoded received data stream that corresponds closely to the reflected light from the light sensor and removes the ambient light.

The system uses the time to digital converters to convert the data stream that includes the reflected light and the ambient light to synchronous data. This data stream is analyzed to determine thresholds associated with the ambient light over time. This data stream is also compared to recently generated thresholds based on the recently analyzed ambient light. The thresholds are determined by generating histograms. This could be averages where the threshold is the average. The ever-changing thresholds are fed back in to the system to compare to the current synchronized data stream.

The present disclosure includes a method that includes generating a decoded output signal that corresponds to reflected light received by a plurality of single photon avalanche diodes (SPAD) by removing ambient light from a plurality of SPAD array output signals. The removing of ambient light including synchronizing the plurality of SPAD array output signals by using a plurality of parallel time to digital converters, each time to digital converter outputting a synchronized SPAD array output signal, determining a plurality of flexible thresholds for each one of the synchronized SPAD array output signals, comparing current data on the synchronized SPAD array output signals with the respective ones of the flexible threshold in a filter, and outputting the first output signal.

The use of SPAD array alongside continuously running Time to Digital converters can be interesting in that a system capable of Time of Flight ranging can also be employed in an alternative mode a data receiver with little or no change to the front end receiver.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

DETAILED DESCRIPTION

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

As used in the specification and appended claims, the use of "correspond," "corresponds," and "corresponding" is intended to describe a ratio of or a similarity between referenced objects. The use of "correspond" or one of its forms should not be construed to mean the exact shape or size.

Figure 1:
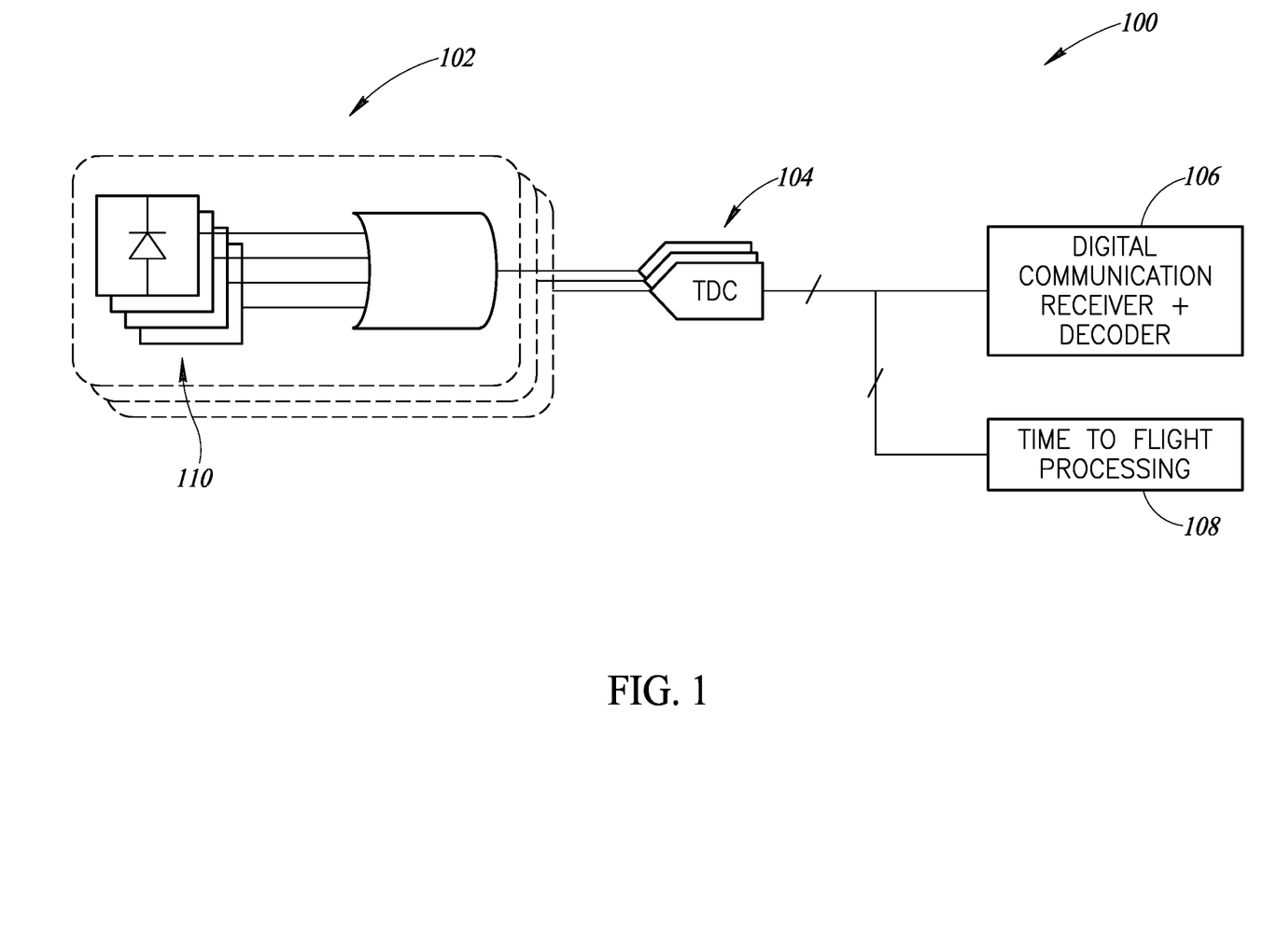
FIG. 1 is a sensor system including time to digital converters according to embodiments of the present disclosure.

The present disclosure is directed to a system that includes time to digital converters in a light communication receiver and decoder to increase bandwidth available with low intensity signals. FIG. 1 is a sensor system 100 that includes one or more Single Photon Avalanche Diode (SPAD) arrays 102 coupled to a plurality of time to digital converters (TDC) 104. The sensor system 100 may be a time of flight sensor that includes an emitting device, such as a laser, that emits pulses of light to an environment. These pulses of light reflect off of items in the environment and the reflected light is detected by the SPAD arrays 102. This reflected light has a relatively low intensity signal as compared to the ambient light that impacts the SPAD arrays.

When detecting the light from the laser, there is ambient light noise (free space propagation of light) in the detection. Changes in the light level are output as the data stream, ones and zeros. It is challenging to detect low intensity signal from reflected light in the presence of high noise from ambient light. Traditional solutions integrate photo-current and use a trans-impedance amplifier to convert current into a voltage. The voltage is then converted into a digital signal to be processed and decoded. This is a very low signal intensity with a need for high bandwidth demands of the time of flight sensor. The output is a small current, but need higher current to be faster to encode photons as ones and zeros.

The sensor system includes a digital communication receiver and decoder 106, which is coupled to outputs of the TDCs 104. These outputs from the TDCs 104 are also received by a time of flight processing circuit 108. The digital communication receiver and decoder circuitry 106 includes filtering to mitigate the effect of ambient light present at the input so that the output of the receiver and decoder 106 is more representative of the reflected light. In 106 this filtering establishes a threshold level which is then used in the processing of a binary data stream at the output. The receiver and decoder circuitry 106 includes programmable digital filtering for accurate background noise tracking and subtraction in a digital signal path.

Each SPAD array 102 includes a plurality of SPAD devices 110 the outputs of which are routed via pulse shapers, to shorten the output pulse time, and then OR'ed together with an OR tree 112. An output of the OR gate 112 is received by a respective one of the TDCs 104. Each of the plurality of SPADs 110 can represent a single diode or a sub-array of diodes that are received by an OR tree, which may have more than one OR gate. Outputs from each of the SPAD arrays 102 are received by a TDC that is operating in parallel with other TDCs. There is a one to one relationship between a number of the outputs of the SPAD arrays 102 and a number of the TDCs.

Figure 2:
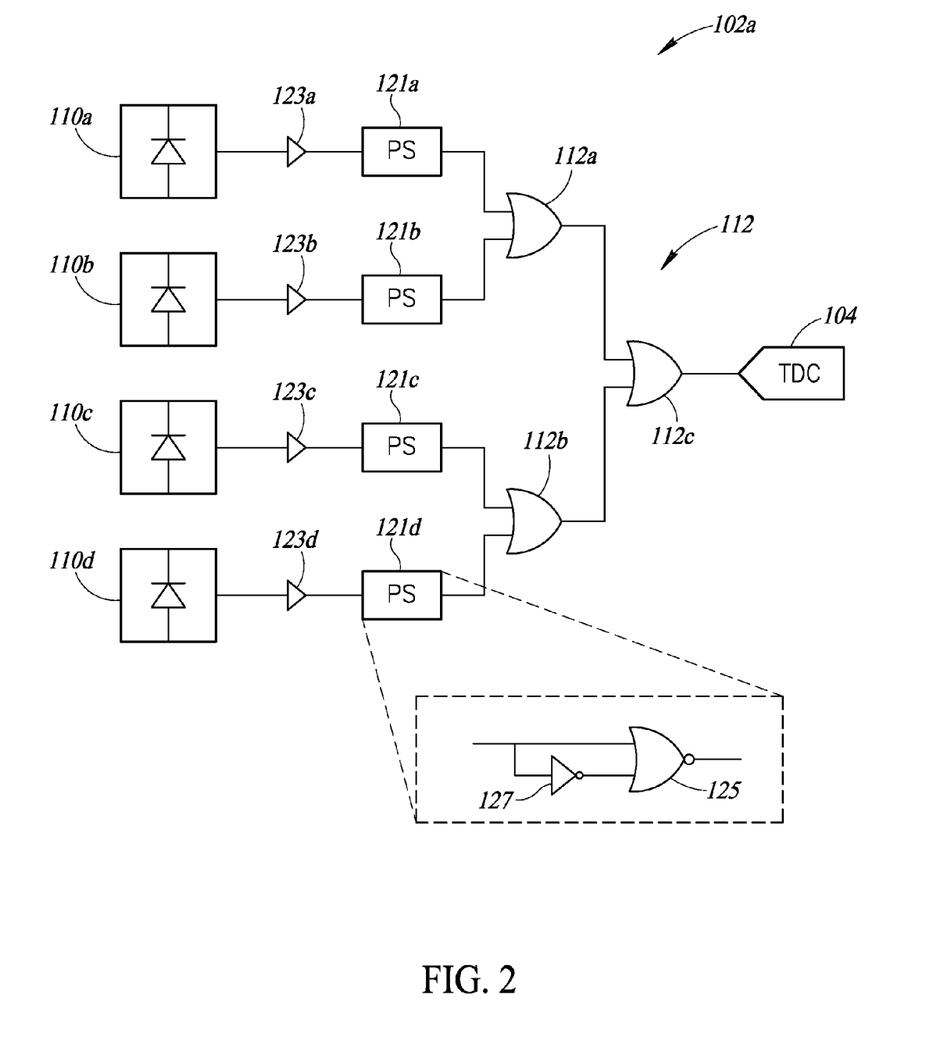
FIG. 2 is an enhanced view of a sub-array of a SPAD array of the sensor system of FIG. 1.

FIG. 2 is an enhanced view of a sub-array 102a of the SPAD array 102. Each SPAD pixel includes a P-N junction that is biased past a breakdown region. This is often referred to as reverse biased. This reverse bias voltage generates an electric field such that a single charge carrier introduced into a depletion layer of the SPAD causes a self-sustaining avalanche. This single charge carrier is generated by a single incident photon striking the SPAD, i.e. a photon from the reflected emitted signal. This sub-array includes four pixels 110a-110d and four pulse shaper circuits 121a-121d coupled to a respective one of the pixels. Each pulse shaper circuit may include a NOR gate 125 that receives at one input an output from the respective pulse shaper circuit and at another input the output from the respective pulse shaper circuit through a NOT gate 127 providing the dual functions of logical inversion and short delay. The sub-arrays may be groups of 128 SPADs that correspond to one TDC. Each pulse shaper may be considered a pulse shortener. The NOT gate path is delayed. The input goes high triggering the NOR gate output and the NOT gate simultaneously. The NOT gate represents both a logical inversion and a time delay. When the pulse has propagated through the NOT gate (and delay) this triggers the NOR gate output to fall even though the input pulse is still high. Hence shaping or reducing the output pulse length in time.

A front-end processing circuit 123a-123d is coupled between the pulse shaper circuits and the pixels. Outputs of a first and second pulse shaper circuit 121a, 121b are received by a first OR 112a of the OR tree 112. Outputs of a third and fourth pulse shaper circuit 121c, 121d are received by a second OR 112b of the OR tree 112. The outputs of the first and second OR 112a, 112b are received by a third OR 112c. An output of the third OR 112c is provided to a respective one of the TDCs 104.

The receiver and decoder circuitry 106 can include the edge detection circuitry and range calculation modules. These range calculation modules may include histogram counter banks that may use memory to count occurrences of edge detection in respective bins corresponding to the different clock phases to provide for histogram generation. Other calculation approaches include sigma delta loops and averaging, to name a few.

Figure 3:
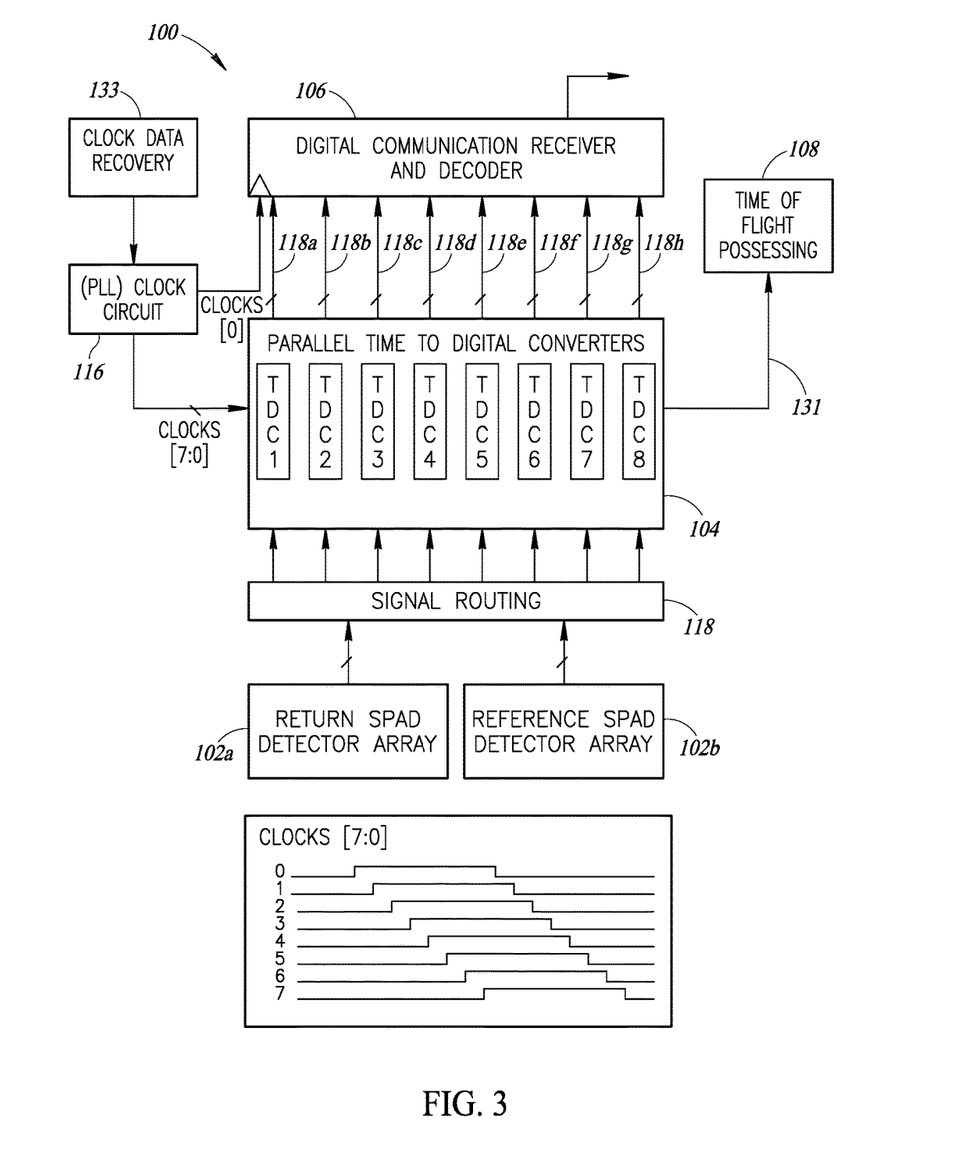
FIG. 3 is a more detailed schematic of the sensor system of FIG. 1.

FIG. 3 is a more detailed schematic of the sensor system 100, which includes a return SPAD detector array 102a and a reference SPAD detector array 102b. Outputs from these SPAD arrays are provided to a signal routing circuit 118. The signal routing circuit 118 couples to a group of parallel time to digital converters (TDCs) 104, TDC1-TDC8. The signal routing circuitry includes a same number of outputs as a number of TDCs. Each respective TDC is coupled to a respective output 118a-118h of the signal routing circuit 118. An output 131 of the TDCs couples to the time of flight processing circuitry 108. A clock data recovery circuit 133 is coupled to a clock circuit 116, which provides clock signals Clock0-Clock7 to the TDCs and to the digital communication receiver and decoder 106.

This sensor system 100 may be included with a time of flight sensor or optical ranging system that includes an optical source (not shown) such as a vertical cavity surface emitting laser (VCSEL). The optical source generates light pulses to determine a distance of the sensor from an object or a target. The optical source transmits the light pulses and the SPAD arrays 102 detect the reflected light. The reference array is on the opposite side of a physical optical barrier in the module. In the silicon the reference and return are physically spaced apart to allow for optical isolation. Ultimately, a digital signal is output based on the SPAD arrays, which represents the presence of the returned light. A distance between the sensor and the object can be determined by analyzing the time from the emission of the pulse to the receipt of the reflection.

This sensor system 100 allows for the outputs of the TDCs 104 to be synchronized within one clock domain. This is achieved with the parallel TDCs and the clock circuitry 116. The clock circuitry 116 may be phase locked loop clock circuitry that generates a plurality of timing or clock signals (Clock0-Clock7) that have different phases. These clock signals are provided to respective ones of the plurality of parallel TDCs 104.

The TDCs convert an event arrival time into a time-stamped digital output. These TDCs provide edge detection (a change from low to high or high to low of a digital signal). These TDCs also provide extraction of histogram data by comparing timing of the received light as output from the SPAD array with the defined clock pulses.

Figure 4:
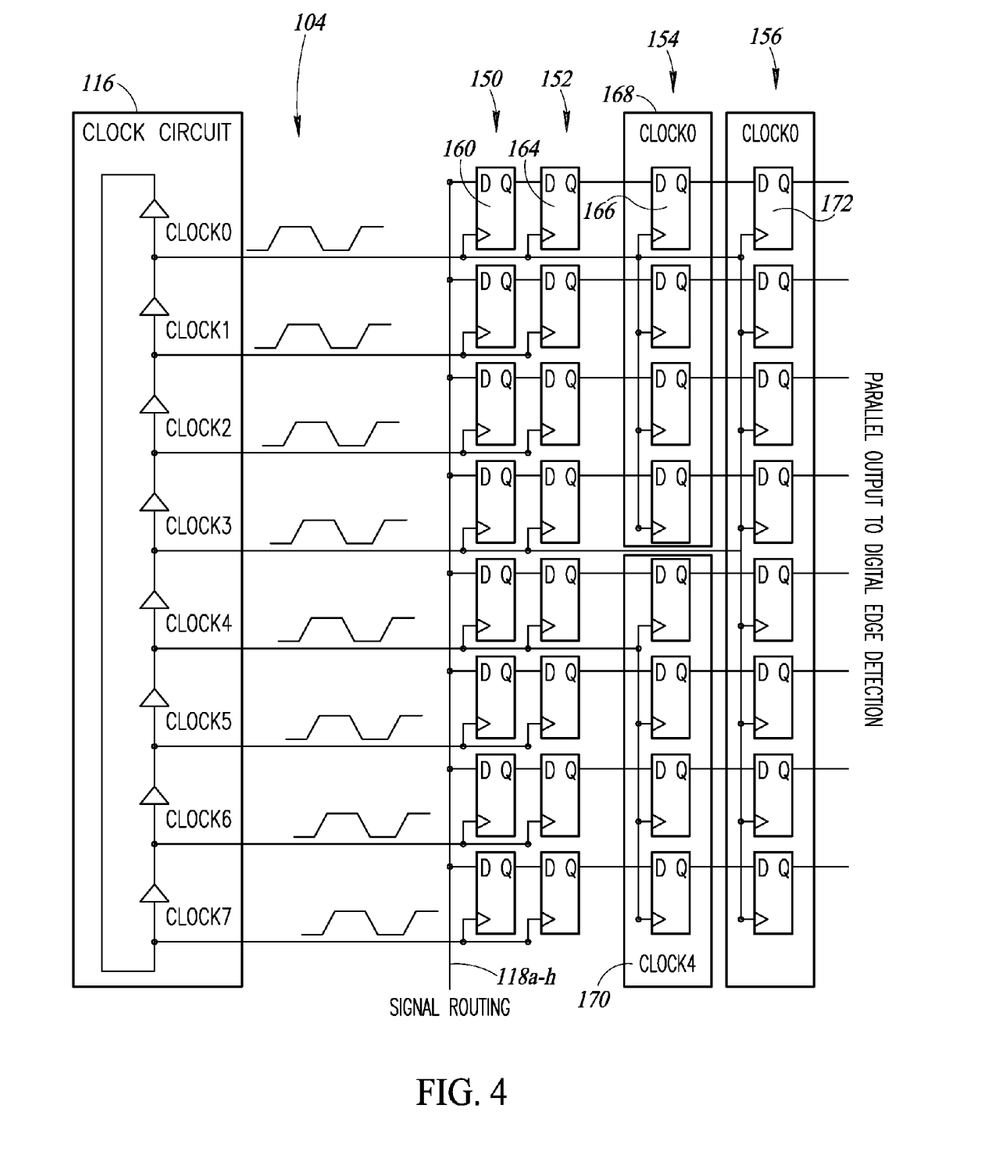
FIG. 4 is a more detailed schematic of time to digital converter circuitry of the sensor system of FIG. 1.

FIG. 4 includes an example of TDC circuitry according to the present disclosure. Each TDC includes a sampling stage 150 that has a plurality of flip-flops 160 where each flip-flop is coupled to one of the plurality of clock signals Clock0-Clock7. Each flip-flop also receives the respective output 118a-118h from the signal routing circuitry 118. The sampling stage samples the digital signal output by the SPAD arrays based on the clock signals from the clock circuitry. At the leading edge of each clock pulse, the TDCs sample the state (High or Low) of the OR tree output. The detection is during the instant of the clock transition from low to high. FIG. 4 is one channel of the TDCs, such that there are multiple ones of these sampling stages, one for each channel output from the signal routing circuit.

The sampling stage 150 is coupled to a re-sampling stage 152, which includes a plurality of flip-flops 164. Each flip-flop of the re-sampling stage is coupled to a respective one of the clock signals Clock0-Clock7. The re-sampling stage provides a respective output from each flip-flop for each clock signal and helps avoid mid-rail condition, such as when the digital signal from the SPAD goes high simultaneously with a clock signal. The re-sampling stage is optional.

The TDCs 104 include a first synchronization stage 154, which includes a plurality of flip-flops 166. The first synchronization stage 154 includes a first group of flip-flops 168 and a second group of flip-flops 170. This first group flip-flops 168 is synchronized to a first one of the clock signals while the second group flip-flops 170 is synchronized to a second one of the clock signals. The first group of flip-flops 168 receives the first clock signal, Clock0. The second group of flip-flops 170 receives the fifth clock signal, Clock4. The first and second groups of flip-flops receive inputs from respective ones of the flip-flops from either the sampling stage or the re-sampling stage.

The TDCs 104 include a second synchronization stage 156, which includes a plurality of flip-flops 172. The second synchronization stage includes a single group of flip-flops 172, which are synchronized with one clock signal, for example, Clock0. This synchronizes all of the outputs of the first synchronization stage with a single clock signal. The outputs of the second synchronization stage are in parallel provided to an edge detection circuit (not shown) which determines the timing window in which the sampled OR tree signal makes a Low to High transition. Outputs from the edge detection circuit are received by the digital communication receiver and decoder 106.

The TDCs 104 may sample the output of the OR tree of the SPAD array at a rate of N GS/s. An 8 bit bus is transferred and output at a clock rate of N divided by 8. The sampling stage 150 samples asynchronous OR tree outputs. The re-sampling stage 152 resamples on the same phase for meta-stability protection. The first synchronization stage 154 re-synchronizes on an intermediate phase and then the second synchronization stage 156 re-synchronizes all channels on a same output clock.

Figure 5:
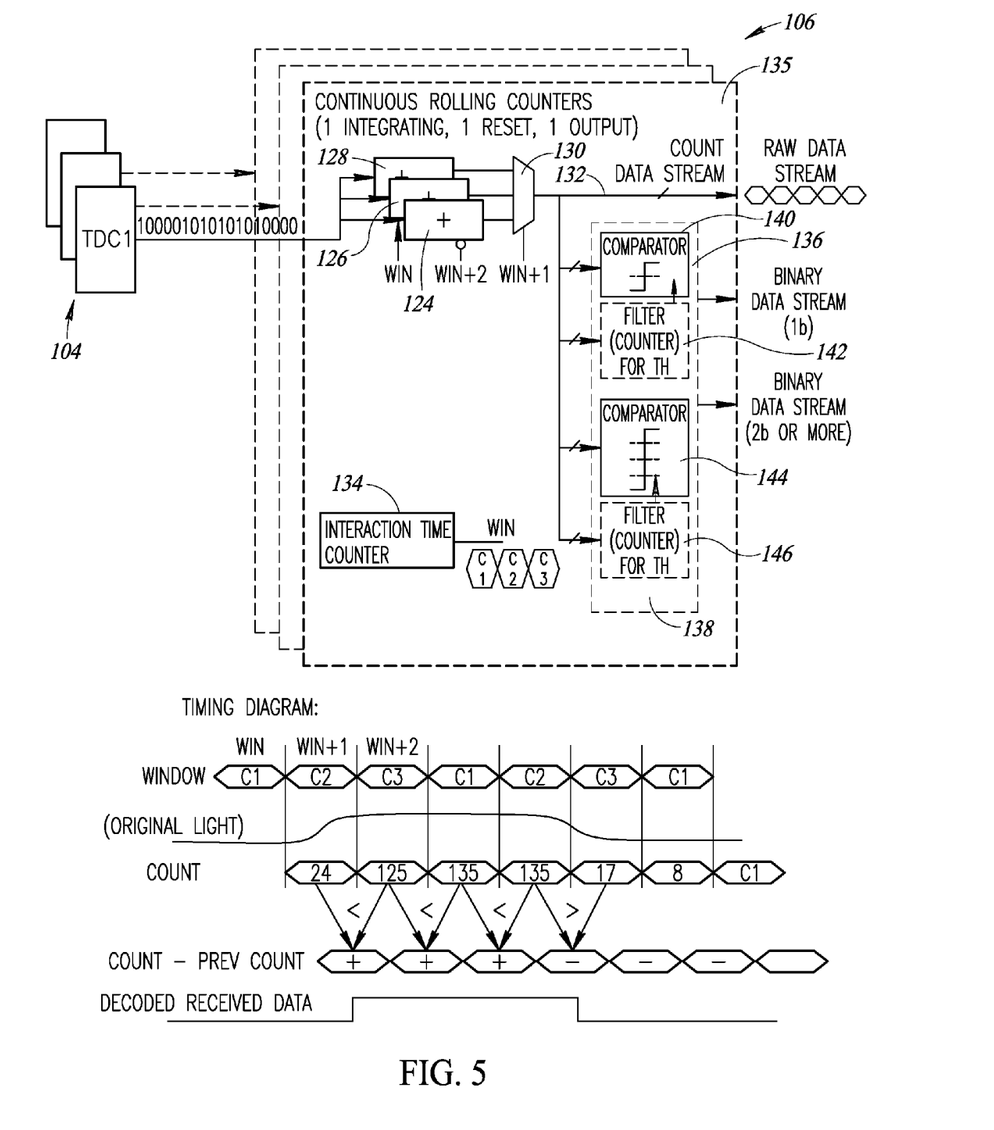
FIG. 5 is a more detailed schematic of receiver and decoder circuitry of the sensor system of FIG. 1.

FIG. 5 is an enhanced view of the receiver and decoder 106 that is coupled to the TDCs 104. The receiver and decoder 106 includes a counter circuit 135 associated with each respective TDC. The counter circuit operates in three time periods, WIN, WIN+1, WIN+2 and includes three continuous rolling counters 124, 126, 128 for each TDC 104. A first rolling counter 124 is for integrating, a second rolling counter 126 is for resetting, and a third rolling counter 128 is for outputting. This is for the first cycle. The next cycle, switches round the functions of the counters (output, integration, reset) and the last cycle switches it again (reset, output, integration). There is a multiplexor 130 that receives outputs from the first rolling counter 124, the second rolling counter 126, and the third rolling counter 128 and has a control input that receives data associated with WIN+1. The multiplexor 130 outputs a data stream 132 that correspond to the raw data stream. The raw data stream is used for histogram analysis which is described in more detail below. The raw data stream may be used for histogram analysis, or any other data processing function, or a secondary communications channel.

The counter circuit 135 includes an integration time counter 134 that corresponds to windows, WIN, WIN+1, WIN+2. During each window a count of photons is collected, C1, C2, C3 from the digital signal output from the synchronized TDCs. Each TDC outputs a stream of ones and zeros, where each one represents one detected photon with high time precision. The rolling counters sum a number of ones that are received during a time period or window. For example, as can be seen in the timing diagram of FIG. 5, WIN corresponds to a count C1, WIN+1 corresponds to a count C2, and WIN+2 corresponds to a count C3. These windows and counts are repeated indefinitely as the system is in operation.

The system can include many types of demodulation processing circuitry be an on-off keying (OOK) circuitry 136 and a pulse amplitude modulation (PAM) circuitry 138. These both may be included and utilized as needed with the operation of the time of flight sensor. The OOK circuitry 136 includes a single level comparator 140 and a filter 142. The filter includes a counter to track an average level for threshold detection. The filter may be an infinite impulse response low pass filter (IIR LPF), which removes ambient light (slow moving light) and outputs signals with high frequencies. The OOK outputs a one bit output. Alternative schemes include phase shift keying and quadrature amplitude modulation (QAM).

The PAM circuitry 138 includes a multi-level comparator 144 and a filter 146. This filter includes a counter to track average level for threshold detection. The multi-level comparator 144 outputs $Log_2(M)$ bits; if there are four levels then there are 2 bits; if there are 8 levels then there are 3 bits.

The data stream 132 is analyzed to output the count, see the timing diagram in FIG. 5. The count represents the number of photons detected during the respective window. As noted in the timing diagram, C1 is 24, C2 is 125, and C3 is 135. The receiver and decoder circuitry 106 compares consecutive counts and determines if there is an increase or a decrease in the count per adjacent window. As noted in the timing diagram, current count minus previous count returns either a positive or a negative. Positive represents an increase and negative represents a decrease. The decoded received data is high when there is a positive results and low when there is a negative result. A relationship between the original light coming into the SPAD array can be compared to the decoded received data, a digital version of the relevant original light. This decoded received data is output as the binary data streams.

The filters 142 and 146 remove the ambient light and background noise, through tracking and subtraction. There is an ideal fixed threshold that when the optical signal passes the threshold, the system will output a 1 on a rising signal or a 0 on a falling signal. This ideal threshold is negatively impacted by ambient light and other interference.

The signal received at each SPAD includes the optical data signal and the ambient interference. If the system uses the ideal threshold, there is a high bit error rate, such that changes in the optical signal (rising or falling, changes in light) may not be significant enough to cross the threshold, see FIG. 6A. This is a result of the ambient light washing out or otherwise preventing detection of the optical data signal. This can occur if the ambient light has a higher intensity or change in light such that the optical data signal from the reflected light from the laser is too small to detect based on the ideal fixed threshold.

Figure 6A:
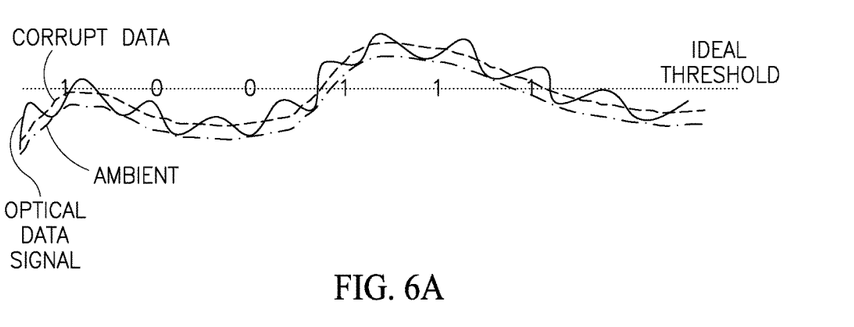
FIGS. 6A and 6B are a representation of ambient light, an optical signal, and related thresholds.

The optical signal in FIG. 6A rises and falls more frequently than the corrupt data signal. The corrupt data signal thus outputs incorrect readings as the ambient light causes the overall light detected to not cross the threshold as frequently as the optical signal actually rises and falls.

Figure 6B:
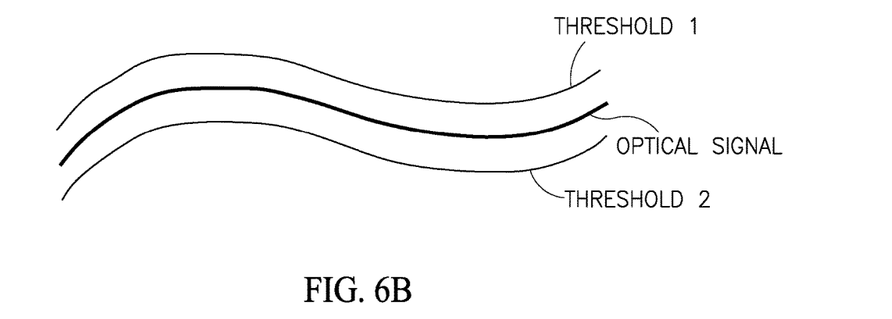

The present disclosure is directed to generating changing or flexible thresholds, such as Threshold 1 and Threshold 2 in FIG. 6B that are based on the ambient light. Above a first threshold will be a one, below a second threshold will be zero, and between the first and second threshold will output the value as received. Thus, the output data stream will be the optical data signal without the ambient light contributions affecting the accuracy of the received or detected signal.

This system evaluates counts over time to learn thresholds to remove ambient light and interferences to provide a more accurate report of the optical signal from the reflected light. The thresholds may be set by averaging, i.e. the counter tracks and average level for the threshold, where the average becomes the threshold. The learned or determined thresholds are output after generation and analysis of histograms, see FIG. 7. As shown in FIG. 5, each filter 142, 146 provide information to the related comparator, 140, 144. This information is the learned threshold data that can change over time. For example, in FIG. 6B, the first and second thresholds are not a fixed value, but instead change over time.

Figure 7:
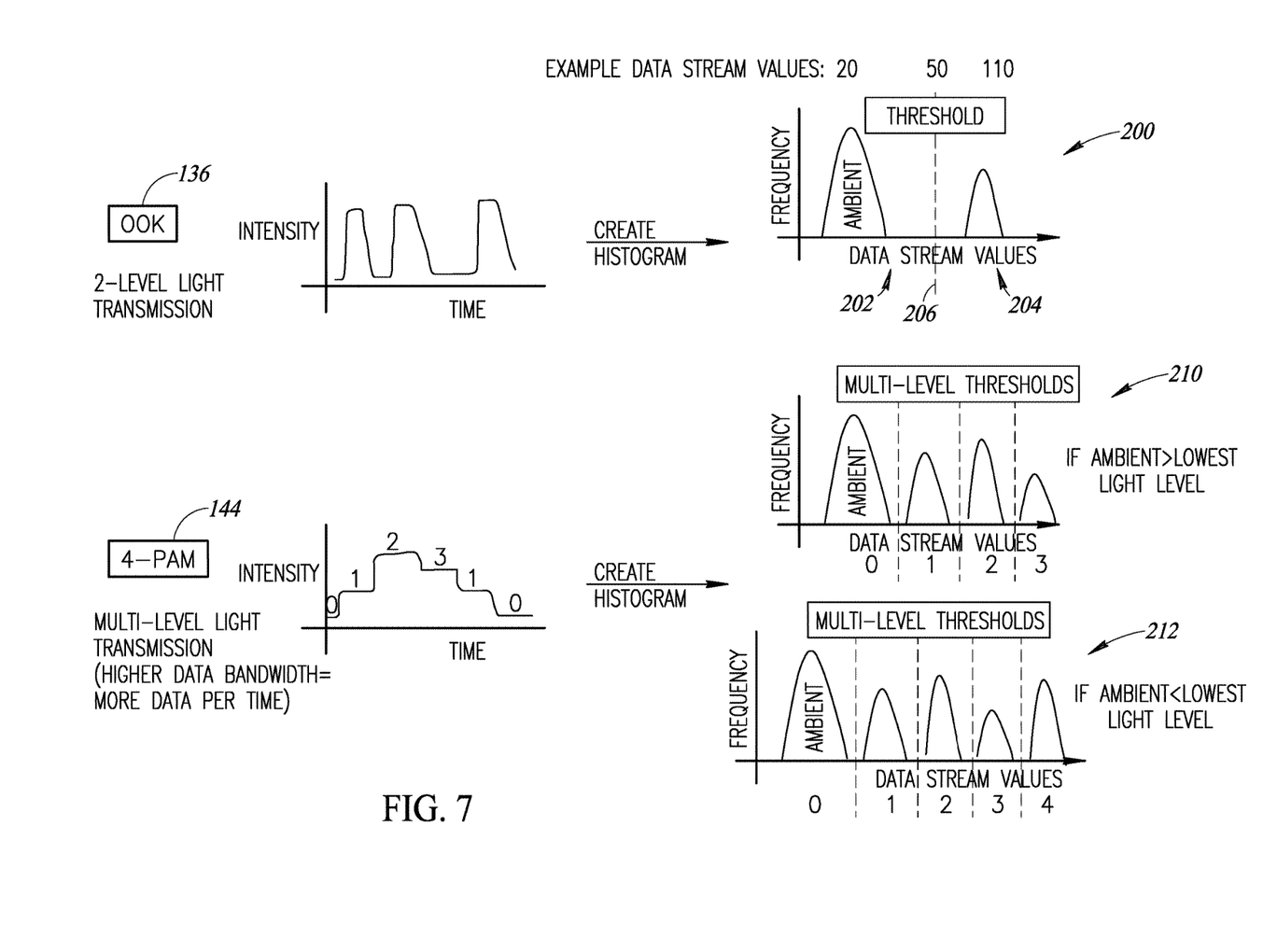
FIG. 7 is graphical representations of histogram functions of the sensor system of FIG. 1.

The raw data stream 132 is evaluated to generate the histograms 200, 210, 212, and is analyzed based on the type of comparator, the OOK and the PAM. The outputs from the histogram analysis are the thresholds for the related filters.

The first part of the ambient light tracking and subtraction is associated with the filters 142, 146. The integration window sums the number of ones received for that channel, then the continuous counter adds together the sums from the integration windows. The secondary continuous counter is a digital low pass filter circuit. The window for the continuous counter is larger than each of the integration windows. The output of the continuous counter is then filtered, such as divided by N, which outputs the sum of photons detected based on the reflected light.

The thresholds are then determined based on the counter data stream over a number of previous samples. For example in FIG. 7, the OOK comparator 136 includes 2-level light transmission such that the histogram 200 has two columns, 202 and 204. The first column 202 represents a number of times the signal below a threshold 206 and the second column represents a number of times the signal is above the threshold 206. The associated intensity, in the left hand image shows one main peak, associated with one threshold.

The PAM comparator 144 can have a variety of thresholds, which is associated with some light sources that have limited bandwidths so more details are useful in understanding the signal; more thresholds equals more information about the signal. The PAM comparator 144 can create a 4 level threshold histogram 210 or a 5 level threshold histogram 212. As such, the intensity per time graph on the left hand side of this Figure shows multiple peaks, which correspond to the multiple thresholds. The threshold limits of the comparators 140 and 144 are set by the histograms of the counter data streams. One example of how the histogram is generated includes using random access memory (RAM) where the RAM data starts at zero. There is a RAM address for each data stream value. The system looks up the RAM associated with the current data stream value. Then the RAM address value is incremented by one and then the system writes the RAM address value to the same address.

The system allows these outputs from the TDCs to all be in the same clock domain, which allows them to be processed and utilized more quickly. For example, the signals may be digitally multiplexed to respective counters or different modes may be multiplexed to different counters with no crossing of clock domains, which avoids timing violations.

Embodiments of the present disclosure include a device that includes a plurality of single photon avalanche diodes (SPADS) that are configured to output a signal representative of detected light. These SPADS are coupled to a plurality of time to digital converters. The device includes a receiver and decoder circuit coupled to the plurality of time to digital converters, which includes a plurality of processing blocks, a number of the plurality of processing blocks corresponding to a number of the plurality of time to digital converters, each processing block configured to receive one of the respective synchronized signals. Each processing block includes a plurality of counters, a first comparator coupled to the plurality of counters, a second comparator coupled to the plurality of counters, a first filter coupled to the first comparator, and a second filter coupled to the second comparator. The device may only include the first filter or the second filter.

The plurality of counters includes an integrating counter, a reset counter, and an outputting counter. Each processing block includes a multiplexor between the plurality of counters and the first and second comparator. The first filter filters are based on a single threshold and the second filter filters are based on a plurality of thresholds. The single threshold and each of the plurality of thresholds are flexible thresholds that change in response to changes in the detected light. The single threshold and each of the plurality of thresholds are determined based on histogram analysis.

The present disclosure also describes a method that includes generating a first output signal that corresponds to reflected light received by a plurality of single photon avalanche diodes (SPAD) by removing ambient light from a plurality of SPAD array output signals. The removing of ambient light includes synchronizing the plurality of SPAD array output signals by using a plurality of parallel time to digital converters, each time to digital converter outputting a synchronized SPAD array output signal, determining a flexible threshold for each one of the synchronized SPAD array output signals, comparing current data on the synchronized SPAD array output signals with the respective flexible threshold in a filter, and outputting the first output signal.

The determining of the flexible thresholds occurs after the synchronizing. The determining of the flexible threshold for each one of the synchronized SPAD array output signals includes generating a histogram for each one of the synchronized SPAD array output signals where a first column of the histogram corresponds to a value below the flexible threshold and a second column of the histogram corresponds to a value above the flexible threshold. The comparison includes counting a number of times that the synchronized SPAD array output signal exceeds the flexible threshold during a plurality of time periods and comparing the number of times that exceed the flexible threshold from a first one of the plurality of time periods with the number of times that exceed the flexible threshold from a second one of the plurality of time periods.

The comparison includes subtracting the number of times that exceed the flexible threshold from the second one of the plurality of time periods from the number of times that exceeds the flexible threshold from the first one of the plurality of time periods. The comparison further includes outputting a first value if the subtracting results in a positive value and outputting a second value if the subtracting results in a negative value. The outputting the first output signal includes outputting a stream of the consecutive first and second values as a result of the subtracting.

The present disclosure includes another method that includes generating a decoded output signal that corresponds to reflected light received by a plurality of single photon avalanche diodes (SPAD) by removing ambient light from a plurality of SPAD array output signals. The removing of ambient light including synchronizing the plurality of SPAD array output signals by using a plurality of parallel time to digital converters, each time to digital converter outputting a synchronized SPAD array output signal, determining a plurality of flexible thresholds for each one of the synchronized SPAD array output signals, comparing current data on the synchronized SPAD array output signals with the respective ones of the flexible threshold in a filter, and outputting the first output signal.

The comparing includes counting a number of times the synchronized SPAD array output signal corresponds to a value between ones of the flexible thresholds. The outputting of the first output signal includes outputting the first output signal with a number of levels that corresponds to a number of the plurality of flexible thresholds.

The system uses the raw data stream and the decoded received data to more quickly and efficiently output data about the information received regarding the reflected signal at the SPAD array. This allows for more precise detection of the reflected signal, which gives more flexibility in how the data can be used by other processes.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A device, comprising:
a plurality of single photon avalanche diodes (SPADS) that are configured to output a signal representative of detected light;
a plurality of time to digital converters coupled to the plurality of SPADs, the plurality of time to digital converters being configured to output respective synchronized signals based on the signal representative of detected light;
a receiver and decoder circuit coupled to the plurality of time to digital converters, the receiver and decoder circuit including:
a plurality of processing blocks, a number of the plurality of processing blocks corresponding to a number of the plurality of time to digital converters, each processing block configured to receive one of the respective synchronized signals, each processing block including:
a plurality of counters;
a first comparator coupled to the plurality of counters;
a second comparator coupled to the plurality of counters;
a first filter coupled to the first comparator; and
a second filter coupled to the second comparator.

2. The device of claim 1 wherein the plurality of counters includes an integrating counter, a reset counter, and an outputting counter.

3. The device of claim 1 wherein each processing block includes a multiplexor between the plurality of counters and the first and second comparator.

4. The device of claim 1 wherein the first filter filters based on a single threshold and the second filter filters based on a plurality of thresholds.

5. The device of claim 4 wherein the single threshold and each of the plurality of thresholds are flexible thresholds that change in response to changes in the detected light.

6. The device of claim 5 wherein the single threshold and each of the plurality of thresholds are determined based on histogram analysis.

7. A method, comprising:
generating an first output signal that corresponds to reflected light received by a plurality of single photon avalanche diodes (SPAD) by removing ambient light from a plurality of SPAD array output signals, the removing of ambient light including:
synchronizing the plurality of SPAD array output signals by using a plurality of parallel time to digital converters, each time to digital converter outputting a synchronized SPAD array output signal;
determining a flexible threshold for each one of the synchronized SPAD array output signals;
comparing current data on the synchronized SPAD array output signals with the respective flexible threshold in a filter; and
outputting the first output signal.

8. The method of claim 7 wherein the determining of the flexible thresholds occurs after the synchronizing.

9. The method of claim 7 wherein the determining of the flexible threshold for each one of the synchronized SPAD array output signals includes:
generating a histogram for each one of the synchronized SPAD array output signals where a first column of the histogram corresponds to a value below the flexible threshold and a second column of the histogram corresponds to a value above the flexible threshold.

10. The method of claim 7 wherein the comparing includes:
counting a number of times that the synchronized SPAD array output signal exceeds the flexible threshold during a plurality of time periods;
comparing the number of times that exceed the flexible threshold from a first one of the plurality of time periods with the number of times that exceed the flexible threshold from a second one of the plurality of time periods.

11. The method of claim 10 wherein the comparing includes subtracting the number of times that exceed the flexible threshold from the second one of the plurality of time periods from the number of times that exceed the flexible threshold from the first one of the plurality of time periods.

12. The method of claim 11 wherein the comparing further includes outputting a first value if the subtracting results in a positive value and outputting a second value if the subtracting results in a negative value.

13. The method of claim 12 wherein outputting the first output signal includes outputting a stream of the consecutive first and second values as a result of the subtracting.

14. A method, comprising:
generating a decoded output signal that corresponds to reflected light received by a plurality of single photon avalanche diodes (SPAD) by removing ambient light from a plurality of SPAD array output signals, the removing of ambient light including:
synchronizing the plurality of SPAD array output signals by using a plurality of parallel time to digital converters, each time to digital converter outputting a synchronized SPAD array output signal;
determining a plurality of flexible thresholds for each one of the synchronized SPAD array output signals;
comparing current data on the synchronized SPAD array output signals with the respective ones of the flexible threshold in a filter; and
outputting the first output signal.

15. The method of claim 14 wherein the comparing includes counting a number of times the synchronized SPAD array output signal corresponds to a value between ones of the flexible thresholds.

16. The method of claim 15 wherein the outputting of the first output signal includes outputting the first output signal with a number of levels that corresponds to a number of the plurality of flexible thresholds.

* * * * *

UNITED STATES PATENT AND TRADEMARK OFFICE
CERTIFICATE OF CORRECTION

PATENT NO. : 10,132,921 B2
APPLICATION NO. : 15/342028
DATED : November 20, 2018
INVENTOR(S) : Neale Dutton et al.

Page 1 of 1

It is certified that error appears in the above-identified patent and that said Letters Patent is hereby corrected as shown below:

On the Title Page

Item (73) Assignee:
"STMICROELECTRONICS (RESEARCH & DEVELOPMENT) LTD, Marlow (GB)" should read:
--STMICROELECTRONICS (RESEARCH & DEVELOPMENT) LIMITED, Marlow (GB)--

Signed and Sealed this
Twenty-eighth Day of January, 2020

Andrei Iancu
*Director of the United States Patent and Trademark Office*